(12) United States Patent
Hsing Chen et al.

(10) Patent No.: US 9,117,731 B2
(45) Date of Patent: Aug. 25, 2015

(54) LIGHT EMITTING DIODE PACKAGE STRUCTURE

(71) Applicant: PROLIGHT OPTO TECHNOLOGY CORPORATION, TaoYuan County (TW)

(72) Inventors: Chen-Lun Hsing Chen, TaoYuan County (TW); Jung-Hao Hung, TaoYuan County (TW); Ding-Yao Lin, TaoYuan County (TW)

(73) Assignee: PROLIGHT OPTO TECHNOLOGY CORPORATION., TaoYuan (TW)

(*) Notice: Subject to any disclaimer, the term of this patent is extended or adjusted under 35 U.S.C. 154(b) by 0 days.

(21) Appl. No.: 14/305,000

(22) Filed: Jun. 16, 2014

(65) Prior Publication Data
US 2015/0091026 A1    Apr. 2, 2015

(30) Foreign Application Priority Data
Oct. 1, 2013   (TW) .............. 102135531 A

(51) Int. Cl.
*H01L 27/15*   (2006.01)
*H01L 33/40*   (2010.01)

(52) U.S. Cl.
CPC ............ *H01L 27/153* (2013.01); *H01L 33/405* (2013.01)

(58) Field of Classification Search
None
See application file for complete search history.

(56) References Cited

U.S. PATENT DOCUMENTS

2006/0118807 A1* 6/2006 Ives et al. .................. 257/99
2010/0301373 A1* 12/2010 Urano et al. ............... 257/98
2012/0228650 A1* 9/2012 Chern et al. ............... 257/88

* cited by examiner

*Primary Examiner* — Thao P Le
(74) *Attorney, Agent, or Firm* — CKC & Partners Co., Ltd.

(57) ABSTRACT

A light emitting diode package structure is provided. The light emitting diode package structure includes at least one light emitting diode unit, an encapsulating body and at least one isolation film. The encapsulating body includes a plurality of surfaces and at least one light-emitting surface, wherein one of the surfaces supports the light emitting diode unit, the other surfaces are exposed. The at least one isolation film is formed on the exposed surfaces. Wherein the isolation film blocks or reflects a portion of light emitted from the light emitting diode unit.

9 Claims, 5 Drawing Sheets

LIGHT EMITTING DIODE PACKAGE STRUCTURE

RELATED APPLICATIONS

The application claims priority to Taiwan Application Serial Number 102135531, filed Oct. 1, 2013, which is herein incorporated by reference.

BACKGROUND

1. Technical Field

The present disclosure relates to a light emitting diode (LED) package structure. More particularly, the present disclosure relates to a light emitting diode package structure with isolation films disposed outside an encapsulating body.

2. Description of Related Art

With energy issues increasingly urgent, LED illumination devices have increasingly received attentions. Due to the characteristics of LED materials, a highly developed photolithography technology can be used to obtain a light emitting diode device with the advantages of quite small size, high light emitting efficiency and long operational life, etc. Therefore, the light emitting diode is applicable to various fields. With the development of portable devices such as smart phones, PDA or tablet computer, a miniature LED package structure is commonly utilized as a backlight source of a compact electronic device.

In actual applications, a subsequent packaging process is required for a bare light emitting diode chip. One of the steps in the packaging process is to form an encapsulating body on the bare light emitting diode chip. The encapsulating body supports the bare light emitting diode chip, and is commonly formed from epoxy resin or a silicon-based material. The encapsulating body has various functions, such as protecting the bare light emitting diode chip from being damaged by outside force, from moisture and oxidation, etc. In addition, a fluorescent material can be added to the encapsulating body for converting a wavelength of a light emitted from the light emitting diode chip, thereby achieving light color conversion.

FIG. 1 is a schematic view showing a conventional LED package structure. A main body 110 includes a bottom 111 and a side surface 112 surrounding the bottom 111. An accommodation space 120 is formed between the bottom 111 and the side surface 112, and the accommodation space 120 has an opening 120a. A light emitting diode chip 130 is disposed on the bottom 111. An encapsulating body 140 fills the accommodation space 120 and supports the light emitting diode chip 130. In general, a reflecting surface 112a is formed on the side surface 112 of the main body 110. Side emitting light of the light emitting diode chip 130 is reflected, and is concentrated towards the opening 120a for increasing light emitting efficiency.

In a manufacturing process of the aforementioned light emitting diode package structure, the body 110 has to be disposed first, and then the encapsulating body 140 fills the accommodation space 120 in a liquid phase initially. After a curing step, the encapsulating body 140 is cured to a solid phase, and the light emitting diode package structure is formed. However, the aforementioned manufacturing process is very complicated, and thus the manufacturing cost thereof is high, and is not favorable for process integration and mass production.

SUMMARY

According to one aspect of the present disclosure, a light emitting diode package structure is provided. The light emitting diode package structure includes at least one light emitting diode unit, an encapsulating body and at least one isolation film. The encapsulating body includes a plurality of surfaces and at least one light-emitting surface, wherein one of the surfaces supports the light emitting diode unit, the other surfaces are exposed. The at least one isolation film is formed on the exposed faces. Wherein the isolation film blocks or reflects a portion of light emitted from the light emitting diode unit.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
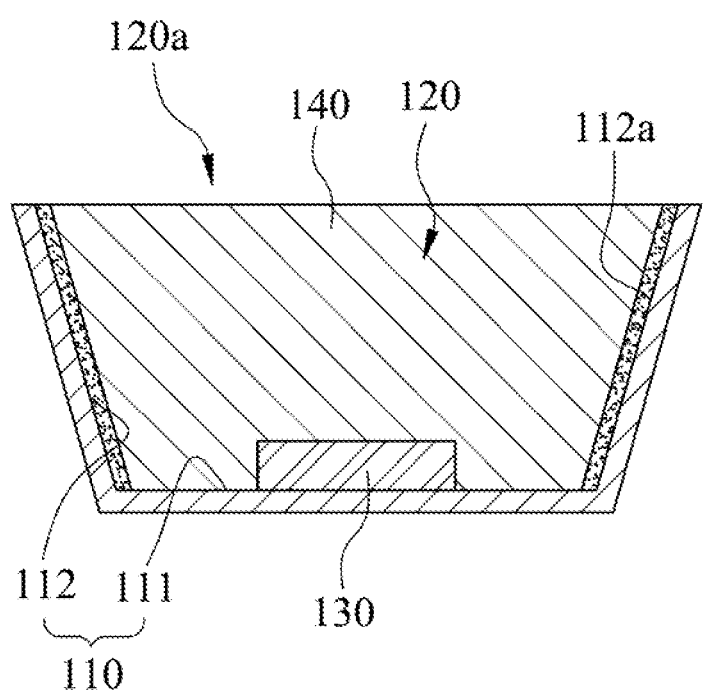
FIG. 1 is a schematic view showing a conventional light emitting diode package structure.

Reference will now be made in detail to the present embodiments of the invention, examples of which are illustrated in the accompanying drawings. Wherever possible, the same reference numbers are used in the drawings and the description to refer to the same or like parts.

The present disclosure provides a light emitting diode package structure. A light emitting diode unit is supported by an encapsulating body, and at least one isolation film is formed outside the encapsulating body. The isolation film can block or reflect side emitting light of the light emitting diode unit, such that the top emitting light of the light emitting diode unit can be enhanced. The light emitting diode package structure of the present disclosure has advantages of simple structure, simple manufacturing process and low manufacturing cost.

Figure 2:
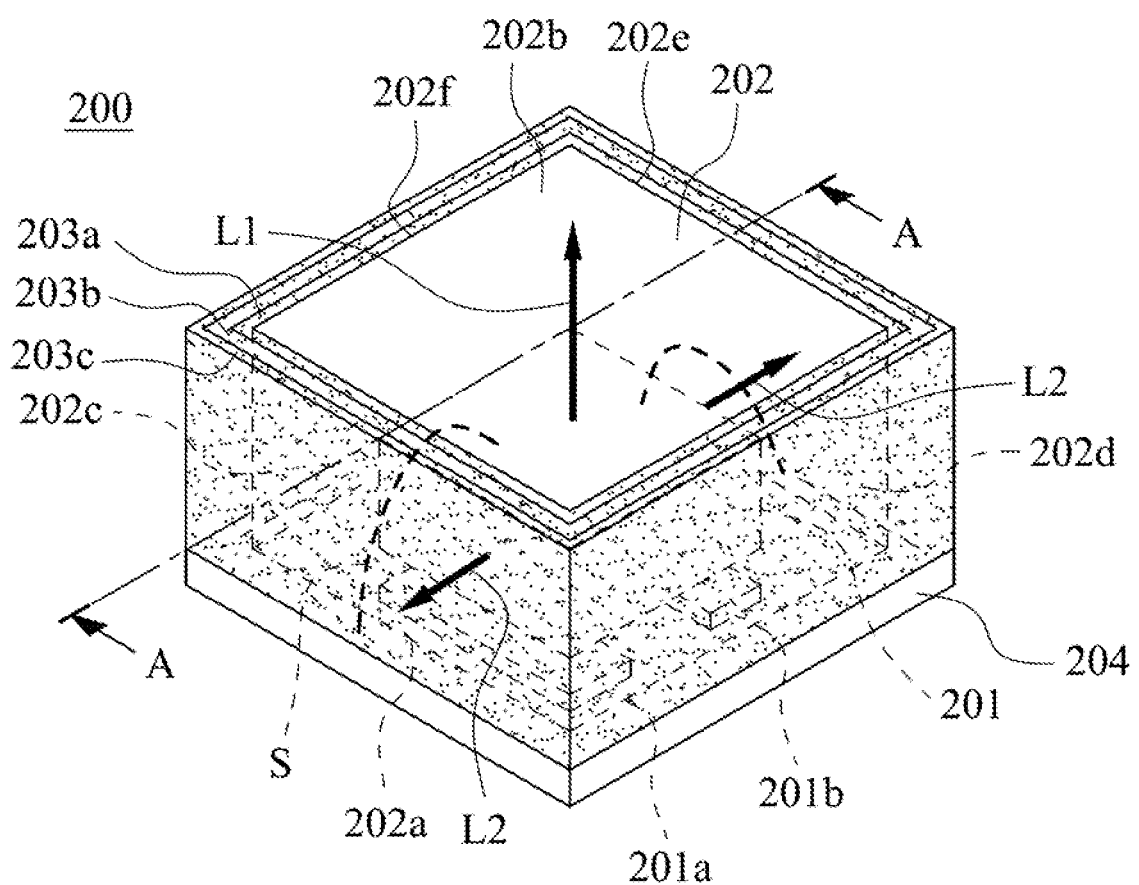
FIG. 2 is a three-dimensional view showing a light emitting diode package structure according to one embodiment of the present disclosure.
Figure 3A:
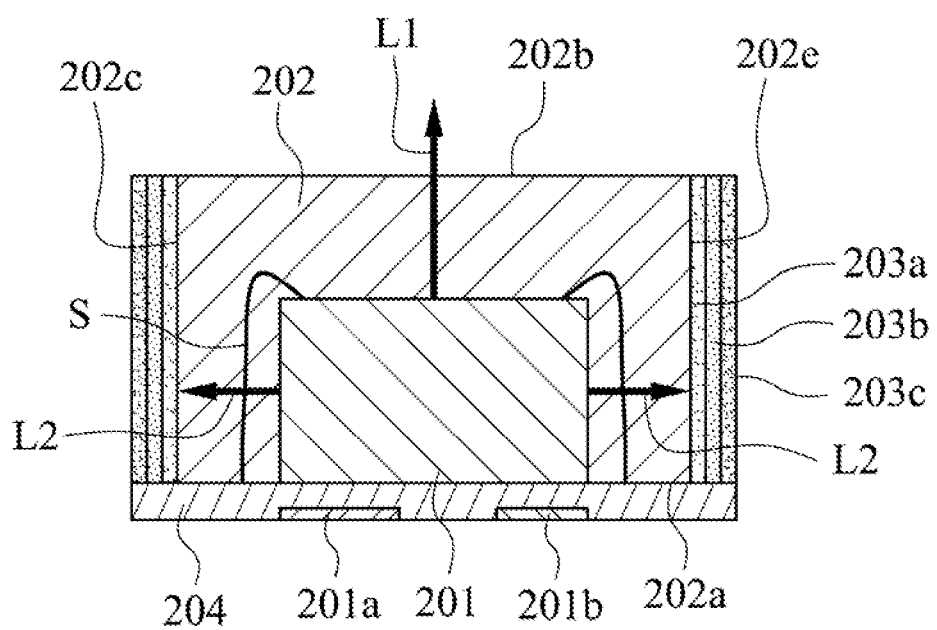
FIG. 3A is a cross-sectional view showing the light emitting diode package structure of FIG. 2 viewed along A-A line in FIG. 2.

FIG. 2 is a three-dimensional view showing a light emitting diode package structure 200 according to one embodiment of the present disclosure; FIG. 3A is a cross-sectional view showing the light emitting diode package structure 200 of FIG. 2 viewed, alone A-A line in FIG. 2; and FIG. 5B is a cross-sectional view showing another example of the light emitting diode package 200 of FIG. 2.

The light emitting diode package structure 200 includes at least one light emitting diode unit 201, an encapsulating body 202, a first isolation film 203a, a second isolation film 203b, a third isolation film 203c and a base 204. It is noted that the quantity of the isolation films is not limited thereto. For example, the light emitting diode package structure 200 can utilize only one isolation film (such as the first isolation film 203a), or two isolation films (such as the second isolation film 203a and the second isolation film 203b). Preferably, three isolation films (203a, 203b and 203c) are utilized. However, more than three isolation films also can be utilized.

The light emitting diode unit 201 can be a vertical-electrode type or a horizontal-electrode type. In FIG. 2, the light emitting diode unit 201 is a horizontal-electrode type. The base 204 is disposed under the light emitting diode unit 201, and an electrical-conductive portion 201a and an electrical-conductive portion 201b are disposed thereon for receiving electric power. The electrical-conductive portion 201a and the electrical-conductive portion 201b are electrically connected to a positive electrode (not shown) and a negative electrode (not shown) by a conductive wire S.

The encapsulating body 202 can be formed from epoxy resin or a silicon-based material. The encapsulating body 202 may have plural surfaces. In the embodiment, the encapsulating body 202 is a hexahedral which includes five surfaces 202a, 203c-202f) and a light-emitting surface 202b. The surface 202a is utilized for supporting the light emitting diode unit 201. Light emitted from the light emitting diode unit 201 is emitted through the light-emitting surface 202b.

The first isolation film 203a is formed on the surfaces 202c-202f except the surface 202a and the light-emitting surface 202b. The second isolation film 203b is formed outside the first isolation film 203a, and the third isolation film 203c is formed outside the second isolation film 203b. The first isolation film 203a, the second isolation film 203b or the third isolation film 203c can be formed by evaporation, sputtering or other methods. The purpose of the first, the second or the third isolation film 203a, 203b or 203c is to block a portion of light emitted from the light emitting diode unit 201. Basically, top emitting light L1 and side emitting light L2 are emitted from the light emitting diode unit 201. In the embodiment, when the side emitting light L2 is emitted to the first, the second or the third isolation film 203a, 203b or 203c, the side emitting light L2 is blocked by the first, the second or the third isolation film 203a, 203b or 203c. Therefore, the side emitting light L2 is inhibited, thus the influence of stray lights can be reduced, and light intensity of the top emitting light L1 is enhanced. In another arrangement, the top emitting light L1 is blocked, and light intensity of side emitting light L2 is enhanced.

In detail, the isolation film can be a multilayer structure, and the first isolation film 203a, the second isolation film 203b or the third isolation film 203c can be formed from a polymer, an inorganic component or a metal, respectively. The inorganic component can be such as $ZrO_2$, $TiO_2$, $BaSO_4$, $SiO_2$, $AlN$ or $Al_2O_3$. In an embodiment, the first isolation film 203a and the third isolation film 203c are polymers, and the second isolation film 203b is a metal. The metal can be such as Al, Pt, Au, Ag, Zn or Cu. When the isolation film is a single layer structure, for example, only the first isolation film 203a is used, and a thickness of the first isolation film 203a is between 0.2 μm and 20 μm. When the isolation film is a multilayer structure, a total thickness of the first isolation film 203a, the second isolation film 203b and the third isolation film 203c is also controlled between 0.2 μm and 20 μm. Therefore, a better light blocking effect can be achieved.

When the first isolation film 203a and the third isolation film 203c are formed from polymers, a better isolation and anti-moisture effect can be achieved. Therefore, an electrical isolation is formed, and the protection effect such as anti-moisture or anti-oxidation is formed to the encapsulating body 202 and the second isolation film 203b. Thus, longer operation life of the light emitting diode package structure 200 can be obtained.

When the second isolation film 203b is formed from a metal, the top emitting light L1 or the side emitting light L2 emitted from the light emitting diode unit 201 is blocked and inhibited. Therefore, the stray lights can be reduced, and light intensity of the top emitting light L1 or the side emitting light L2 which is not blocked is enhanced. Specifically, light intensity of the top emitting light L1 is generally greater than that of the side emitting light L2. Therefore, the side emitting light L2 is blocked, and light intensity of the top emitting light L1 is enhanced.

Figure 3B:
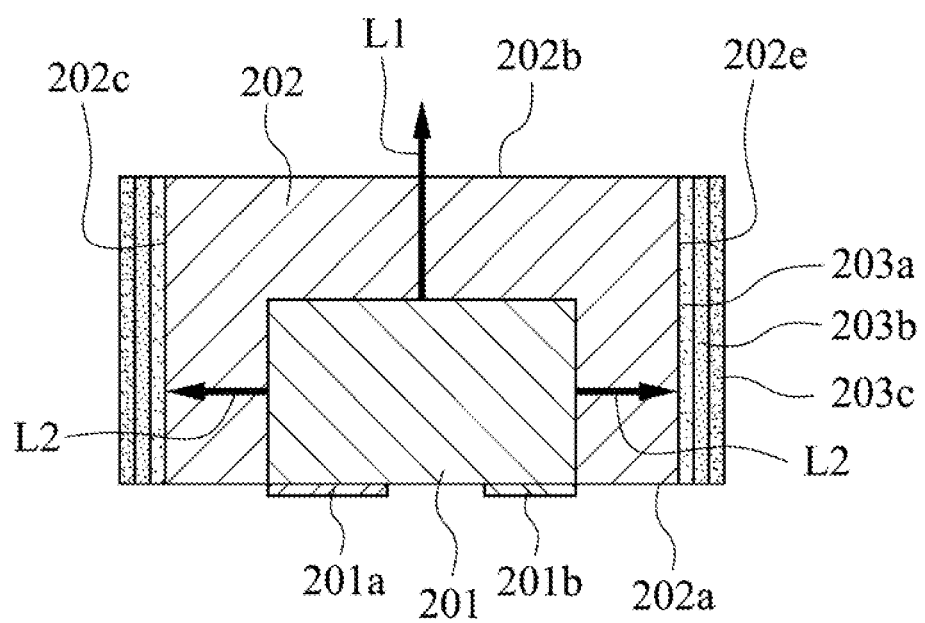
FIG. 3B is a cross-sectional view showing another example of the light emitting diode package of FIG. 2.

In FIG. 3B, the light emitting diode unit 201 is a flip chip type light emitting diode. Therefore, the electrodes thereof can be used as the electrical-conductive portions 201a and 201b. In one example, a molding method is directly utilized for allowing the encapsulating body to support the light emitting diode unit 201 without disposing the base 204, and thus the manufacturing cost can be reduced.

Figure 4:
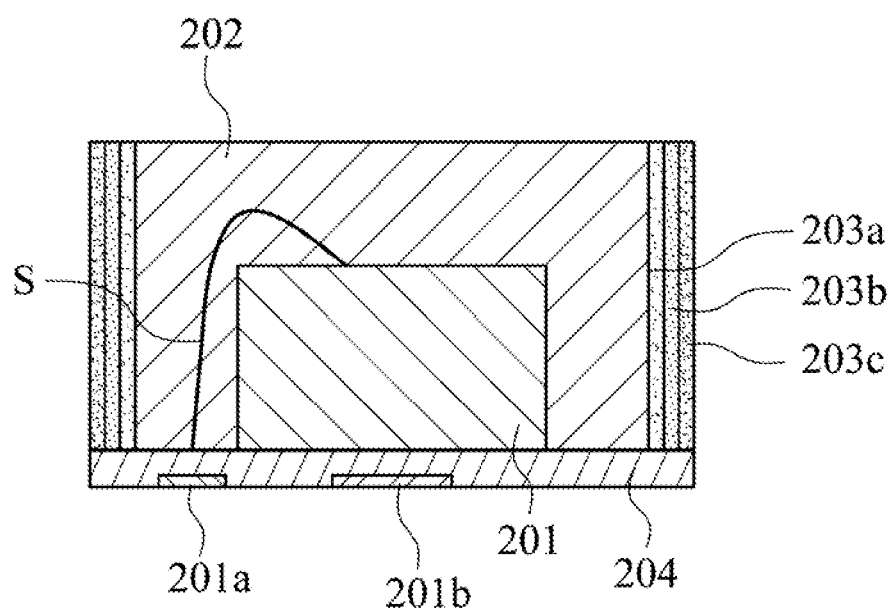
FIG. 4 is a schematic view showing another example of the light emitting diode unit of FIG. 2.

FIG. 4 is a schematic view showing another example of the light emitting diode unit 201 of FIG. 2. The light emitting diode unit 201 could have various types. For example, in FIG. 2, a horizontal type light emitting diode unit 201 is showed; and in FIG. 4, a vertical type light emitting diode unit 201 is showed. In FIG. 4, since the vertical type light emitting diode unit 201 is used, its positive and negative electrodes (not shown) are formed on the top side and the bottom side of the light emitting diode unit 201 respectively, one electrode can be connected to the electrical-conductive portion 201a by a conductive wire S, and the other electrode can be electrically connected to the other electrical-conductive portion 201b through the base 204, thereby forming electrical connections.

Figure 5:
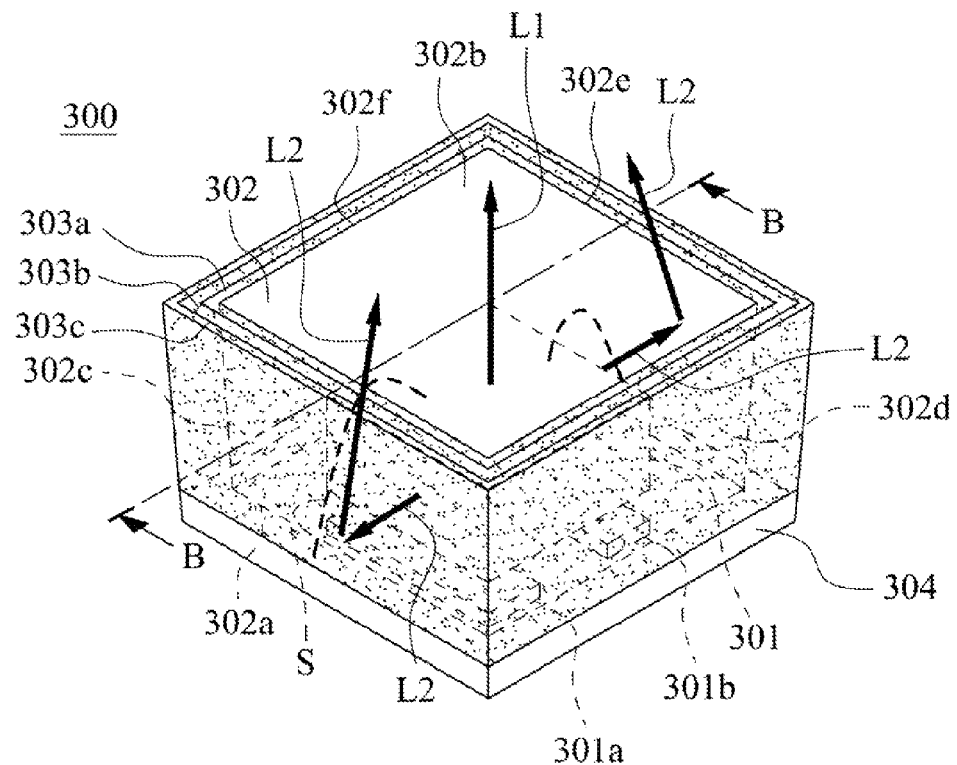
FIG. 5 is a three-dimensional view showing a light emitting diode package structure according to another embodiment of the present disclosure.

FIG. 5 is a three-dimensional view showing a light emitting diode package structure 300 according to another embodiment of the present disclosure. In FIG. 5, the light emitting diode package structure 300 is similar to the light emitting diode package structure 200 in FIG. 2. The light emitting diode package structure 300 includes at least one light emitting diode unit 301, an encapsulating body 302, a first isolation film 303a, a second isolation film 303b, a third isolation film 303c and a base 304.

The light emitting diode unit 301 can be a vertical-electrode type or a horizontal-electrode type. In FIG. 5, the light emitting diode unit 301 is a horizontal-electrode type. The base 304 is disposed under the encapsulating body 302 for supporting the light emitting diode unit 301 or the encapsulating body 302, and an electrical-conductive portion 301a and an electrical-conductive portion 301b are disposed on the base 304 for receiving electric power. The electrical-conductive portion 301a and the electrical-conductive portion 301b are electrically connected to a positive electrode (not shown) and a negative electrode (not shown) by a conductive wire S for forming an electrical connection.

The encapsulating body 302 can be formed from an epoxy resin or a silicon-based material. The encapsulating body 302 can have plural surfaces. In the embodiment, the encapsulating body 302 is a hexahedron which includes five surfaces 302a, 302c, 302d, 302e and 302f, and a light-emitting surface 302b. The surface 302a is utilized for supporting the light emitting diode unit 301. A light emitted from the light emitting diode unit 301 is emitted through the light-emitting surface 302b.

The first isolation film 303a is formed on the surfaces 302c-302f except the surface 302a and the light-emitting surface 302b. The second isolation film 303b is formed outside the first isolation film 303a, and the third isolation film 303c is formed outside the second isolation film 303b. The first isolation film 303a, the second isolation film 303b or the third isolation film 303c can be formed by evaporation, sputtering or other methods. The purpose of the first, the second or the third isolation film 303a, 303b and 303c is to reflect a portion of light emitted from the light emitting diode unit 301. Basically, top emitting light L1 and side emitting light L2 are emitted from the light emitting diode unit 301. In the embodiment, when the side emitting light L2 is emitted to the first isolation film 303a, the second isolation film 303b or the third isolation film 303c, the side emitting light L2 is reflected. Therefore, light path of the side emitting light L2 is changed and thereby being concentrated toward light directions of the top emitting light L1, thus light intensity of the top emitting light L1 is enhanced. In another example, it also can make the top emitting light L1 to be reflected, and light intensity of side emitting light L2 is enhanced.

The first isolation film 303a, the second isolation film 303b or the third isolation film 303c can be formed from a polymer, an inorganic component or a metal, respectively. The inorganic component can be such as $ZrO_2$, $TiO_2$, $BaSO_4$, $SiO_2$, AlN or $Al_2O_3$. In an embodiment, the first isolation film 303a and the third isolation film 303c are polymers, and the second isolation film 303b is a metal; the metal can be such as Al, Pt, Au, Ag, Zn or Cu.

When the isolation film is a single layer structure, for example, only the first isolation film 303a is used, and a thickness of the first isolation film 303a is between 0.2 μm and 20 μm. When the isolation film is a multilayer structure, a total thickness of the first isolation film 303a, the second isolation film 303b and the third isolation film 303c is also controlled between 0.2 μm and 20 μm. Therefore, a better light reflecting effect can be achieved.

When the first isolation film 303a and the third isolation film 303c are formed form polymers, a better isolation and anti-moisture effect can be achieved. Therefore, an electrical isolation is formed, the protection effect such as anti-moisture or anti-oxidation is formed to the encapsulating body 302 and the second isolation film 303b. Thus, longer operation life of the light emitting diode package structure 300 can be obtained.

When the second isolation film 303b is formed from a metal, the top emitting light L1 or the side emitting light L2 emitted from the light emitting diode unit 301 is reflected. Therefore, light intensity of the top emitting light L1 or the side emitting light L2 can be enhanced. Commonly, light intensity of the top emitting light L1 is generally greater than that of the side emitting light L2. Therefore, the side emitting light L2 is reflected, and light intensity of the top emitting light L1 is enhanced.

Figure 6:
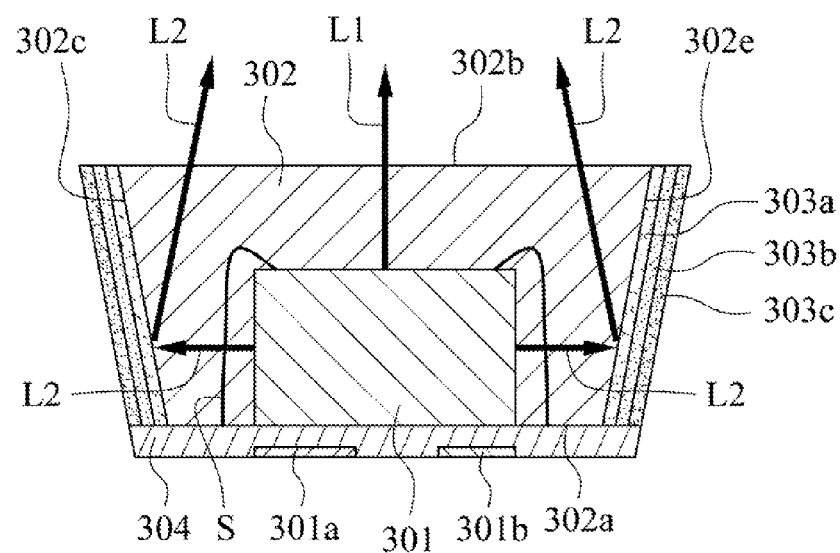
FIG. 6 is a schematic view showing another example of the encapsulating body of FIG. 5.

FIG. 6 is a schematic view showing another example of the encapsulating body 302 of FIG. 5. For obtaining a better light reflecting effect, the surfaces 302c-302f of the encapsulating body 302 can be inclined plans, thus various light reflecting angle can be obtained, and light intensity of the top emitting light L1 can be enhanced. Therefore, light emitting efficiency is increased.

In conclusion, the present disclosure provides a light emitting diode package structure. The light emitting diode package structure includes at least one light emitting diode unit, an encapsulating body and at least one isolation film. One surface of the encapsulating body supports the light emitting diode unit in order to provide anti-moisture, anti-oxidation, anti-shocking, and longer operation life. The emitting surface of the encapsulating body is for allowing the light being emitted through. At least one isolation film is formed on the encapsulating body for blocking or reflecting the top emitting light or the side emitting light of the light emitting diode unit.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A light emitting diode package structure, comprising:
   at least one light emitting diode unit;
   an encapsulating body comprising a plurality of surfaces and at least one light-emitting surface, wherein one of the surfaces supports the light emitting diode unit, the other surfaces are exposed; and
   two or more isolation films sequentially stacked on the exposed surfaces;
   wherein the isolation films block or reflect a portion of light emitted from the light emitting diode unit.

2. The light emitting diode package structure of claim 1, wherein a total thickness of the isolation films is between 0.2 μm and 20 μm.

3. The light emitting diode package structure of claim 1, wherein a thickness of each isolation film is between 0.2 μm and 20 μm.

4. The light emitting diode package structure of claim 1, wherein each of the isolation films is formed from a polymer, an inorganic component or a metal.

5. The light emitting diode package structure of claim 4, wherein the metal is Al, Pt, Au, Ag, Zn or Cu.

6. The light emitting diode package structure of claim 4, wherein the inorganic component is $ZrO_2$, $TiO_2$, $BaSO_4$, $SiO_2$, AlN or $Al_2O_3$.

7. The light emitting diode package structure of claim 1, wherein the light emitting diode unit is a vertical electrode type LED or a horizontal electrode type LED.

8. The light emitting diode package structure of claim 1, wherein no base or a base is disposed under the encapsulating body; and when the base is disposed, the light emitting diode unit or the encapsulating body is supported by the base.

9. The light emitting diode package structure of claim 1, wherein each of the exposed surfaces is an inclined surface or a vertical surface.

* * * * *